(12) United States Patent
Takashima et al.

(10) Patent No.: US 8,136,911 B2
(45) Date of Patent: Mar. 20, 2012

(54) PATTERNING APPARATUS, METHOD FOR MAKING ORGANIC ELECTROLUMINESCENT ELEMENT, ORGANIC ELECTROLUMINESCENT ELEMENT, AND ORGANIC ELECTROLUMINESCENT DISPLAY

(75) Inventors: Yousuke Takashima, Tokyo (JP); Nobuhiko Takashima, Tokyo (JP); Masaaki Murayama, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 885 days.

(21) Appl. No.: 11/994,101

(22) PCT Filed: Jul. 4, 2006

(86) PCT No.: PCT/JP2006/313262
§ 371 (c)(1),
(2), (4) Date: Feb. 26, 2008

(87) PCT Pub. No.: WO2007/004627
PCT Pub. Date: Jan. 11, 2007

(65) Prior Publication Data
US 2009/0039772 A1    Feb. 12, 2009

(30) Foreign Application Priority Data
Jul. 5, 2005    (JP) .................................. 2005-196024

(51) Int. Cl.
*B41J 29/393* (2006.01)
*B41J 29/38* (2006.01)

(52) U.S. Cl. ..................... 347/19; 347/5; 347/9; 347/12; 347/13; 347/14

(58) Field of Classification Search ................ 347/9, 14, 347/19
See application file for complete search history.

(56) References Cited

U.S. PATENT DOCUMENTS

| 2004/0115344 A1* | 6/2004 | Newsome et al. ............ 427/162 |
| 2004/0179060 A1* | 9/2004 | Iwata ............................. 347/37 |
| 2006/0132735 A1* | 6/2006 | Lof et al. ........................ 355/53 |

FOREIGN PATENT DOCUMENTS

| JP | 2003265996 | 9/2003 |
| JP | 2004216737 | 8/2004 |
| JP | 2004253179 | 9/2004 |
| JP | 2004305912 | 11/2004 |
| JP | 2004337728 | 12/2004 |
| JP | 2005502447 | 1/2005 |
| JP | 2005502452 | 1/2005 |
| JP | 2005125241 | 5/2005 |

* cited by examiner

*Primary Examiner* — Ryan Lepisto
(74) *Attorney, Agent, or Firm* — Lucas & Mercanti, LLP (57) ABSTRACT

A patterning apparatus for performing highly accurate patterning to substrates continuously transferred is provided. Furthermore, a method for manufacturing an organic electroluminescence element wherein such patterning apparatus is employed, an organic electroluminescence element and an organic electroluminescence display device obtained by using such manufacturing method are provided.

11 Claims, 4 Drawing Sheets

PATTERNING APPARATUS, METHOD FOR MAKING ORGANIC ELECTROLUMINESCENT ELEMENT, ORGANIC ELECTROLUMINESCENT ELEMENT, AND ORGANIC ELECTROLUMINESCENT DISPLAY

TECHNICAL FIELD

The present invention relates to a patterning apparatus and a method of manufacturing an organic electroluminescence element using the patterning apparatus thereof.

BACKGROUND

In recent years, there has been a rapid development of a light emitting element using an organic substance for a emission layer, as a self-light emitting display to take the place of a liquid crystal display. As forming processes of the emission layer made up of an organic substance in an organic EL (electroluminescence) element, a method of forming a film by vapor deposition of a low molecula material, as disclosed in the Appl. Phys. Lett. 51(12), 21 Sep. 1987, p. 913, and a method of coating a high molecular material, as disclosed in the Appl. Phys. Lett. 71(1), 7 July (1997), p. 34 have been mainly developed.

As methods of colorizing there are cited a metal mask patterning method mainly used for the low molecular material, and a liquid droplet ejection patterning method mainly used for the high molecular material.

The metal mask patterning method is a method where light emitting materials having different luminescent colors are deposited by vapor deposition on a desired portion corresponding to pixels over the mask of a predetermined pattern to form a film. The liquid droplet ejection patterning method is a comparatively easy method since it can carry out direct patterning on the portion corresponding to the pixel and is drawing attention.

The metal mask patterning method requires to form films by pattering the organic layers which emit lights in blue (B), green (G) and red (R). However, since it is very difficult to form this organic layer by patterning such as etching or other method after formation of the film, a method where the layers are stacked sequentially by vapor deposition on a first pixel electrode through a vapor deposition mask having a desired pattern is employed. However, this method uses dedicated masks for light emitting organic layers of B, G and R colors for the purpose of preventing contaminations. This involves complicated alignment work. Further, this method requires a troublesome positioning and at the same time it is not effective in improving productivity because of sheet handling process.

In the liquid droplet ejection patterning method, on the other hand, the liquid droplet ejection apparatus is provided with a plurality of liquid droplet ejection heads for ejecting liquid droplets wherein these liquid droplet ejection heads are arranged at uniform pitches to form a group of heads. The head group scans a substrate in the direction of scanning, and ejects liquid droplets at the same time, whereby the liquid droplets of B, G and R colors are ejected onto the substrate. The position of the substrate perpendicular to a scanning direction is adjusted by moving a mount for carrying the substrate. In this method, however, the liquid droplet ejection apparatus scans the substrate which may be contaminated by the operation of the liquid droplet ejection apparatus. Further, as disclosed in the Unexamined Japanese Patent Application Publication No. 2003-251247, sheet handling processing is mostly performed while the substrate is being fixed, and this will not enhance the productivity.

One of the methods proposed to solve the problem of productivity is to create an organic electroluminescence element by forming a functional film on the substrates being conveyed successively.

For example, a technique has been proposed to coat the whole surface of the substrate by bringing a coating solution in contract with the substrate while conveying it (Patent Document 1). This technique may be effective in forming a film on the whole surface of the substrate such as a common functional layer of organic electroluminescence, but is not applicable to the patterning of the B, G and R light emitting layers.

There is disclosed another technique to coat the B, G and R emission layer s in a shape of stripes through a buffer solution (Patent Document 2). This document shows that intermittent formation in a dotted form is also acceptable. However, to cope with patterning on the pixel electrode formed by the arrangement of deltas and mosaic structures, it is necessary to provide three outlets for the B, G and R emission layer s and two outlets for buffer solutions for each pixel. This is not practicably possible. This method has been found to be applicable only to the patterning of the pixel electrode of stripe arrangement in practice.

As described above, the conventional emission layer patterning method is mainly based on the method of sheet processing with the substrate placed at a fixed position, and this arrangement involves productivity problems. At the same time, in the continuous processing mode wherein substrates are conveyed on a continuous basis, there is found no conventional technique capable of achieving the precision patterning of the emission layer.

Patent Document 1: Unexamined Japanese Patent Application Publication No. 2001-6875

Patent Document 2: Unexamined Japanese Patent Application Publication No. 2001-267068

DISCLOSURE OF THE INVENTION

Problem to be Solved by the Present Invention

An object of the present invention is to solve the aforementioned problems and to provide a patterning apparatus for high-precision patterning of the substrates being conveyed on a continuous basis; a method of production an organic electroluminescence element using this patterning apparatus; an organic electroluminescence element obtained by this production method; and an organic electroluminescence display apparatus.

Means to Solve the Problem

The aforementioned object of the present invention has been achieved with a patterning apparatus, having: a image detection device to detect an alignment mark formed on a substrate in advance; a speed detection device to detect a conveyance speed of the substrate to be conveyed; and an ejection detection device to combine feedback data of the image detection device and the speed detection device; wherein function liquid is ejected through a nozzle ejection device to the substrate to being conveyed in accordance with an ejection command signal of the ejection control device.

Preferably, the feedback data of the image detection device detects an amount of elongation and misalignment of the substrate based on the alignment marks formed at both ends of the substrate and ejection is carried out while carrying out fine adjustment of the nozzle ejection device based on a detected result thereof.

The objects of the present Invention are also obtained with a manufacturing method of an organic electroluminescence element having at least one function layer between an anode and a cathode on a substrate, wherein the at least one function layer is formed by the patterning apparatus described above.

Preferably, at least one function layer is formed using organic electroluminescence function liquid. Suitably, the at least one function layer is a light emission layer.

Preferably, the nozzle ejection device is configured by arranging a plurality of nozzle ejection heads in a width direction of the substrate.

It is also preferred that the substrate is wound in the shape of a roll on one side of the apparatus, is fed as a continuing flexible belt sheet through the apparatus, and then rewound in shape of a roll on the other side of the apparatus.

Suitably, a three nozzle ejection devices device is provided in a substrate conveyance direction, respectively ejecting any one of the organic electroluminescence function liquid to form light emission layers which have emission colors selected among blue, green and red.

Suitably, the conveyance speed of the substrate through the apparatus is 5 m/min. or less.

Also, suitably a fluctuation of the conveyance speed of the substrate is ±10% or less in respect to a an average speed of the substrate.

In the organic electroluminescence element produced by the manufacturing method of the organic electroluminescence element of the present invention uses a light emitting mechanism based on phosphorescence.

An organic electroluminescence display unit can be made with a plurality of the organic electroluminescence elements of the present Invention.

Effect of the Invention

According to the present invention, a high resolution patterning for the substrate continuously conveyed is possible and in particular a technology adaptable to form the emission layer of the organic electroluminescence element is proved.

DESCRIPTION OF SYMBOLS

1 Droplet ejection head
2 Piezoelectric vibration element
3 Nozzle
4 Droplet
5 Substrate supplying section
6 Substrate
7 Substrate recovering section
8 Atmosphere control chamber
10 Application liquid supplying device
13 Control section
20 Image detection device
21 Speed detection device
23 First pixel electrode
24 Alignment mark
35 Roll rotating electrode (first electrode)
36 Grope of prismatic fixed electrode (second electrode)
40 Electric field applying device
50 Gas supplying device
60 Electrode temperature adjusting device
61 Die coater
62 ITO electrode (indium tin oxide electrode)
63 Hole transfer layer
64 Red light emission layer
65 Green light emission layer
66 Blue light emission layer
67 Electron transfer layer
68 vapor deposition head
69 Cathode

THE PREFERRED EMBODIMENT OF THE INVENTION

In the patterning apparatus of the present invention, the configuration described in this application enables a high resolution patterning for the substrate conveyed continuously and in particular enables to provide a patterning device adaptable for forming the emission layer of the organic electroluminescence element. Also, the production method of organic EL (electroluminescence) element using the patterning apparatus, the organic electroluminescence element and the display device using the production method have been able to be provided.

<<Patterning Apparatus>>

A patterning apparatus of the present invention will be described.

In the patterning apparatus of the present invention, alignment mark detection (position information detection) and conveyance speed detection (conveyance condition detection) are integrated and controlled so as to realize high accuracy patterning even if the conveyance speed of the substrate conveyed is continuously fluctuated. Under an ideal condition of a constant conveyance speed, patterning is deemed to be possible by detecting only the alignment mark, however, in a conveyance configuration such as roll to roll in particular, as a matter of fact, usually there are variations of the conveyance speed, thus it is difficult to realize high resolution patterning in a pixel forming area by detecting only the alignment mark. Also, in ejection control by detecting only the alignment mark, since there is no adjustability for the conveyance speed, it is necessary to wait until the conveyance speed becomes consistent which is not preferable from the view point of productivity.

The control section detects the alignment mark of the substrate and receives the conveyance speed of the substrate as feedback data, then outputs an ejection command after combining both data i.e. position information and the conveyance speed.

For example, in case the conveyance speed is lower than usual, a time span from detecting the alignment mark to ejection becomes long, and in case the conveyance speed is higher than usual, the time span from detecting the alignment mark to ejection becomes short.

Also, since the control section logs data of change with time of the substrate conveyance speed, it can predict the substrate conveyance speed after elapsing minute time component. Therefore, in a step of changing the conveyance speed, micro patterning is possible.

In the present invention, the alignment mark is provided on the optical transparency substrate of the organic electroluminescence element for positioning to eject the organic functional material. The alignment mark is simultaneously formed with an ITO film or a chrome film which forms the first pixel electrode on the optical transparency substrate.

As an alignment detection method, a light source is arranged at one side of the substrate and a CCD camera is arranged at the other side of the substrate, then the light source radiates light on the alignment mark and then the transmitted light enters into the camera so as to photograph the vicinity of the mark position, thereby of the position information acknowledgement is obtained based on the image photographed.

An embodiment of the present invention will be described with reference to the drawings as follow.

Figure 1:
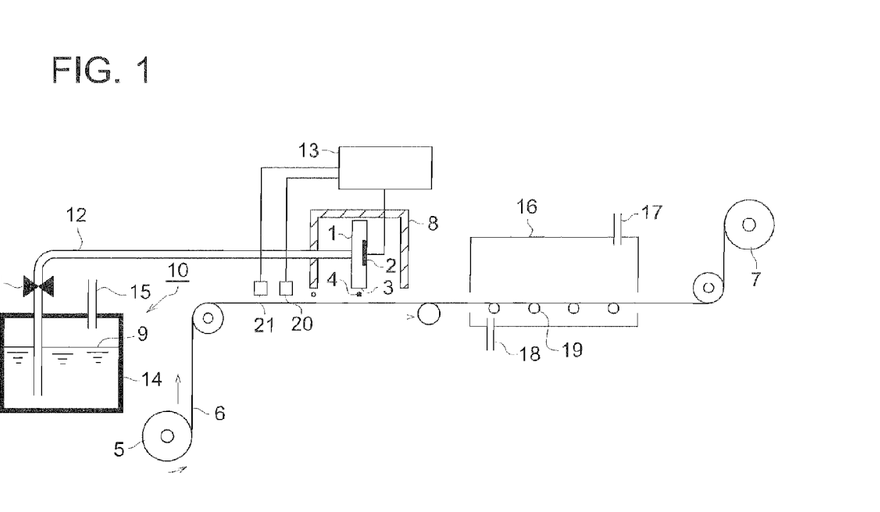
FIG. 1 is a schematic diagram showing an example of the patterning apparatus used in the present invention.

FIG. 1 is a schematic diagram showing an example of a patterning apparatus using droplet ejection method.

In FIG. 1 a model where a droplet ejection head 1 is driven by a piezoelectric element (PZT) 2 to eject a droplet 4 from a nozzle 3 is shown, either an ejection head of thermal type or electrostatic suction type can be used. A numeral 5 denotes a substrate supplying section, numeral 6 denotes a substrate, numeral 16 denotes a drying box, numeral 17 denotes heated air inlet, numeral 18 is heated air outlet and numeral 19 shows conveyance rollers. A numeral 7 is a substrate recovering section. FIG. 1 is an example of conveying the flexible substrate 6 which can be not only the flexible substrate having a specific width but a leaf substrate precut one by one.

A numeral 20 denotes an image detection device to detect the alignment mark formed on the substrate, numeral 21 denotes a speed detection device to detect the conveyance speed of the substrate, numeral 9 denotes an application liquid and numeral 10 denotes an application liquid supplying device. The application liquid 9 reserved in the application liquid supplying device 10 is fed through a control valve 11 and piping 12 and supplied to the droplet ejection head 1.

To the droplet ejection head 1, the control section 13 is connected though a connector to drive the piezoelectric vibration element 2. To the control section 13, the alignment detection section and the substrate conveyance speed detection section are connected respectively. The control section 13 selects an operation intensity and a frequency of the piezoelectric vibration element 2, and nozzle 3 at application liquid ejection while compensating appropriately according to results of both detections i.e. alignment detection and substrate conveyance speed detection. The liquid tank 14 of the application liquid supplying device 10 is substantially sealed, and a breathing pipe 15 is provided to partially communicate with outside air. The breathing pipe 15 is necessary when the application liquid 9 is supplied from the droplet ejection head 1 by operation of the piezoelectric vibration element 2.

At an upstream side of the droplet ejection nozzle, an image detection device 20 including CCD camera to detect the alignment mark on the substrate is equipped. The image detection device detects the alignment mark on the substrate through the CCD camera, and carries out data transmission of the position information of the substrate. At the same time, the control section send a command of relative position adjustment of the substrate and the head, and a command of ejection nozzle selection to the droplet ejection head section so as to accomplish positioning between the substrate and the ejection head. Meanwhile, the droplet ejection head is provided with a mechanism and motors for X (vertical), Y (horizontal) and θ (rotation) so that the relative position to the substrate is corrected in accordance with the detected result of the alignment mark.

Also, at the same time, a conveyance speed detection device 21 to detect the conveyance speed of the substrate is provided at the upstream side of the droplet ejection head. The speed detection device for the substrate continuously conveyed sends a measured conveyance speed signal of the substrate to the control section and can accurately determine an emission timing of a selected nozzle determined by alignment mark detection in accordance with the conveyance speed of the substrate. Here, the speed detection device for the substrate can be a non-contact measuring method using a laser or revolution counting method using a rotary encoder mounted on the roller.

It is preferred that by storing the droplet ejection head 1 in an atmosphere control chamber 8, and controlling an atmosphere (temperature and humidity) of the atmosphere control chamber 8, atmosphere control of vicinity of the droplet ejection head 1 is performed. However, in case the piezoelectric vibration element 2 is used in the droplet ejection head 1, since the piezoelectric vibration element absorbs moisture under a high humidity atmosphere, Atmosphere control is preferred to be carried out under a humidity condition of not more than 70%.

Figure 2:
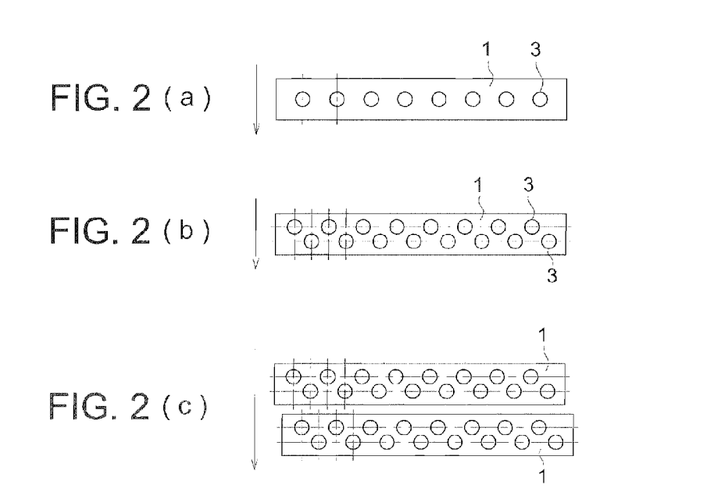
FIGS. 2a, 2b, and 2c illustrate the nozzle location of a droplet ejection head.

FIG. 2 is a front view of the droplet ejection head 1 viewed from the nozzle port side.

As FIG. 2 (a) shows, the droplet ejection head 1 can be the one where nozzles 3 are arranged in a single line, or as FIG. 2 (b) shows, a plurality of nozzle arrays configured with a plurality of the nozzles 3 are arranged in parallel each other with setting back by a half of nozzle pitch so as to increase density of the droplet formed on the substrate 6. Further, in FIG. 2 (C), the droplet ejection heads 1, where the plurality of the nozzle arrays are arranged in parallel, are arranged and set back by a quarter of nozzle pitch in a array direction to form a plurality of arrays of droplet ejection head, thereby more dense ejection can be carried out. As a nozzle pitch, it is preferred that one or tow nozzles are arranged per one pixel. In the figure, the arrow shows the conveyance direction of the substrate 6.

Also, a plurality of sets of the same type of droplet head 1 can be arranged alternately in the width direction of the substrate 6.

Figure 3A:
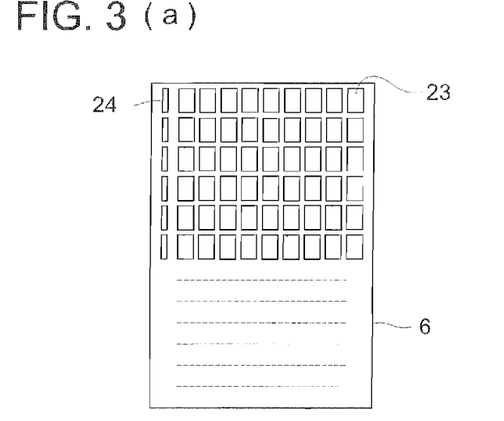
FIGS. 3a, 3b, 3c illustrate a substrate on which pixel electrodes and alignment marks are formed.
Figure 3B:
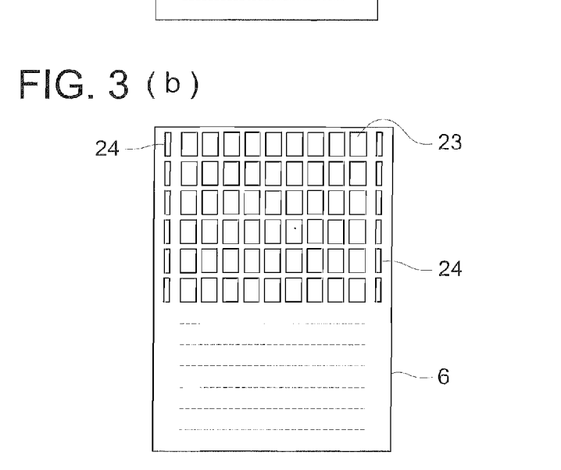
Figure 3C:
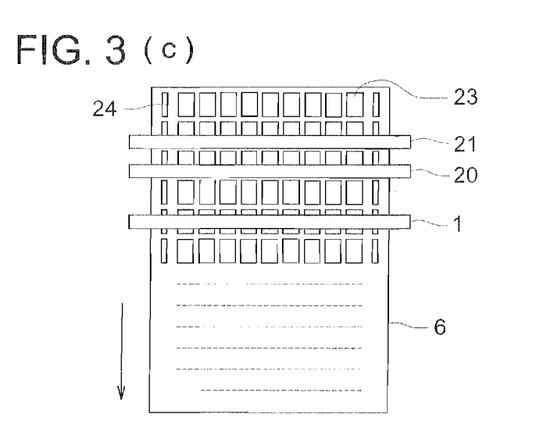

FIG. 3 shows an example of a sheet type substrate where the alignment mark 24 and the first pixel electrode 23 formed in advance on the substrate 6. The substrate 6 can be a continuous substrate.

In FIG. 3 (a), the first pixel electrode 23 is patterned in advance on a portion which becomes each pixel of the organic electroluminescence on the substrate 6. Also, at one end of each pixel line, the alignment mark 24 is formed. As FIG. 3 (b) shows, the alignment marks 24 can be arranged at both end sections of each pixel line. In case ejection control is carried out by detecting misalignment or deformation, alignment marks at both end sections of each pixel line are preferred.

In FIG. 3 (c), the substrate 6 is conveyed in the direction of the arrow, the droplet ejection head 1 in which the material application liquids to form the emission layer s of three colors are filled is provided, and at the upstream side thereof, the image detection device 20 to detect alignment and the conveyance speed detection device 21 are provided.

Ejection is carried out while the ejection control command is being compensated by combining both detection results from the image detection device 20 to detect the alignment mark and the speed detection device 21, thus compared to the ordinary ejection only based on the alignment mark detection result, accurate ejection control is possible and in particular a highly accurate patterning is possible.

<<Organic Electroluminescence Function Solvent>>

The organic electroluminescence function solvent related to the present invention will be described.

As the organic electroluminescence function solvent related to the present invention, a state (solvent) or a dispersion liquid where materials of organic EL element which configures a function layer (also called organic EL function layer, organic layer or organic compound layer) configuring organic EL element of the present invention described later such as a gas barrier layer, the first pixel electrode, the hole transfer layer, the emission layer, electron transfer layer, the second pixel electrode, and a encapsulation layer is dissolved or dispersed in the solvent is cited Also, a density of the material of the organic EL element in the organic electroluminescence function liquid is preferred to be within a range of 0.1 to 10 percent by weight. The aforesaid density range means the density range of solid contents in case the organic electroluminescence function liquid is dispersion liquid and the same value range is cited as a preferable range.

<<Medium (Solvent) Used for Organic Electroluminescence Function Liquid Preparation>>

The solvent used for preparation of the organic electroluminescence function liquid related to the present invention is not limited in particular and appropriately selected. For example, halogen series solvents such as chloroform, carbon tetrachloride, dichloromethane, 1,2-dichloroethane, dichlorobenzene, dichloro hexanon and, ketone series solvents such as acetone, methyl ethyl ketone, diethyl ketone, methyl isobutyl ketone, n-propyl methyl ketone and cyclohexanone, aromatic series solvents such as benzene, toluene, and xylene, ester series solvents such as ethylacetate, n-propyl acetate, n-butyl acetate, methyl propionate, ethyl propionate, gamma-butyrolactone, and diethyl carbonate, ether system solvents such as tetrahydrofuran and dioxane, alcoholic series solvents such as methanol, ethanol, 1-butanol, and ethylene glycol, amide series solvents such as dimethylformamide and dimethylacetamide, nitrile series solvents, such as acetonitrile and propionitrile, and dimethyl sulfoxide, water, and these mixed solvents are cited. Meanwhile, the organic electroluminescence functional fluid of a hydrophilic application liquid or a hydrophilic dispersion liquid can be obtained if alcoholic series solvents such as water, methanol, 1-butanol and ethylene glycol, ether series solvents such as tetrahydrofuran and dioxane, amide series solvents such as dimethylformamide and dimethylacetamide, and these mixed solvents in the above are used.

<<Gas Barrier Layer>>

A transparent resin film is cited as a belt-shaped flexible support used for the beltlike flexible support wherein the first pixel element electrode and an alignment mark were already formed on the gas barrier layer used for the present invention. As a resin film, for example, polyester, such as polyethylene terephthalate (PET) and polyethylenenaphthalate (PEN), cellulose ester series such as polyethylene polypropylene cellophane, cellulose diacetate, cellulose triacetate, cellulose acetate, butyrate, cellulose acetate propionate (CAP), cellulose acetate phthalate (TAC) and nitrocellulose, or those derivatives, polyvinylidene chloridep, polyvinyl alcohol, polyethylene vinyl alcohol, syndiotactic polystyrene polycarbonate, norbornane resin, poly methyl pentene, polyether ketone, polyimide, polyether sulfone (PES), polyphenylene sulfide, polysulfones series, polyether imide, polyether ketone imide, polyamide, a fluororesin, nylon, polymethylmethacrylate, an acrylic or polyarylates, and cycloolefin series resin, such as Aton™ (product of JSR corporation), APL™ (product of Mitsui Chemicals Inc.) are cited.

It is preferable that a gas barrier film is formed on a surface of the resin film used as the belt-shaped flexible support if needed. As a gas barrier film, a coating film of an inorganic substance, an organic substance, or a hybrid coating film of both of them are cited. It is preferable that as characteristics of a gas barrier film, the water vapor transmittance (25±0.5 degrees C., RH (90±2) % RH) measured by a method based on JIS K 7129-1992 is not more than 0.01 g/($m^2 \cdot 24$ h).

Furthermore, it is more preferred to be a high barrier film where an oxygen permeability measured by the method based on JIS K 7126-1987 is not more than $10^{-3}$ ml/($m^2 \cdot 24$ hr·Mpa) and the water vapor transmittance (25±0.5 degrees C., RH (90±2) %RH) measured by the method based on JIS K 7129-1992 is not more than $10^{-5}$ g/($m^2 \cdot 24$ h).

As a material to form a barrier film, a material which has only to have a function to suppress infiltration of substances such as water and oxygen cause deterioration, for example, oxidation silicon, a silicon dioxide, silicon nitride, can be used. Furthermore, in order to improve the brittleness of this coating film, it is more preferable to give a layered structure configured with these inorganic layers and layers configured with organic materials. While there is no restriction about the laminating order of an inorganic layer and an organic layer in particular, it is preferable to stack both layers in a plurality of times. As for the forming method of a barrier film, there is no restriction in particular and for example, a vacuum vapor deposition method, a sputtering method, a reactive-sputtering method, a molecular beam epitaxy method, the ionized cluster beam method, the ion plating method, the plasma polymerizing method, the atmospheric pressure plasma polymerizing method, plasma CVD method, a laser CVD method, a heat CVD method, and a coating method, can be used. The atmospheric pressure plasma polymerizing method listed in Unexamined Japanese Patent Application Publication No. 2004-68143 is particularly preferable.

For the first picture element electrode, metal, alloy, the electrical conductivity compounds, and mixtures of the materials thereof having a large work function (not less than 4 eV) are preferably used as electrode materials. As specific examples of electrode material, such as metals i.e. Au, and conductive transparent materials, such as CuI, indium tin oxide (ITO), $SnO_2$, and ZnO, are cited. Moreover, a material such as IDIXO ($In_2O_3$ and ZnO) which can form the transparent conductive membrane can be used. For the anode, a thin film is formed with electrode material by methods such as vapor deposition or sputtering, then a desired pattern can be formed by the photo lithography method, or in case required pattern accuracy is relatively not high (100 μm or over), the patter can be formed through the mask of a desired form at the time of vapor deposition or sputtering of the above-mentioned electrode material. Or in case a substance capable of coating such an organic conductivity compound is used, a wet film forming method such as a print method or a coating method can be used.

When taking out the light from this anode, it is preferable to increase transmissivity more than 10%, and the sheet resistance for the anode is preferred to be some hundreds of ohms/□. Furthermore, a film thickness of 10 nm-1000 nm or preferably 10 nm-200 nm is usually chosen depending on material.

A positive hole injection layer (anode buffer layer) can exist between the first pixel element electrode and a luminescent layer or a hole transfer layer which is specifically described in second part, second chapter "electrode material" (123-166 pages) of "Organic EL device and its industrialization front (Nov. 30, 1998 N T S company issuance)". The anode buffer layer (positive hole injection layer) is specifically described in Unexamined Japanese Patent Application Publications No. 9-45479, No. 9-260062 and No. 8-288069, and as specific examples, such as the phthalocyanine buffer layer represented by copper phthalocyanine, an oxide buffer layer represented by vanadium oxide and the macromolecule buffer layer using conducting polymers such as an amorphous carbon buffer layer, poly aniline (emeraldine), and poly thiophene are cited.

The hole transfer layer is configured with the hole transporting material having function to convey a positive hole, and includes a positive hole injection layer and an electronic blocking layer in the broad sense. A single or a plurality of hole transfer layer s can be provided. As a hole transporting material, any of an organic substance or an inorganic substance capable of injecting or transporting the positive hole, or having a characteristic of electronic barrier can be used. For example, a triazole derivative, an oxydiazole derivative, an imidazole derivative, poly aryl alkane derivative, a pyrazoline derivative, and a pyrazolone derivative, a phenylenediamine derivative, an arylamine derivative, the amino substitution chalcone derivative, an oxazole derivative, a styryl anthracene derivative, a fluorenone derivative, a hydrazone derivative, a stilbene derivative, a silazane derivative, an aniline series copolymer and a conducting polymer oligomer, especially a thiophene oligomer, are cited.

While the above-mentioned materials can be used as the hole transporting material, it is preferable to use a porphyrin compound, an aromatic series tertiary amine compound, a styryl amine compound, and especially an aromatic series tertiary amine compound.

As the example of representation of an aromatic series tertiary amine compound and a styryl amine compound, N,N,N',N'-tetra-phenyl-4,4'-Diamino phenyl; N,N'-diphenyl-N,N'-bis(3-methylphenyl)-[1,1'-biphenyl]-4,4'-diamine(TPD); 2,2-bis(4-di-p-tolylamino phenyl)propane; 1,1-bis(4-di-p-tolylamino phenyl)cyclohexane; N,N,N',N'-tetra-p-tolyl-4,4'-diamino biphenyl; 1,1-bis(4-di-p-tolylamino phenyl)-4-phenylcyclohexane; bis(4-dimethylamino-2-methyphenyl) phenylmethane; bis(4-di-p-tolylamino phenyl) phenylmethane; N,N'-diphenyl-N,N'-di(4-methoxyphenyl)-4,4'-diamino biphenyl; N,N,N',N'-tetraphenyl-4,4'-diamino diphenyl ether; 4,4'-bis(Diphenyl amino)quodli phenyl; N,N,N-tri(p-tolyl)amine; 4-(di-p-tolylamino)-4'-[4-(di-p-tolylamino)styryl]stilbene; 4-N,N-diphenyl amino-(2-diphenyl vinyl)benzene; 3-methoxy-4'-N,N-diphenyl amino stil benzene; N-phenyl carbazole, Furthermore, the one which has two fused aromatic rings described in the U.S. Pat. No. 5,061,569 in the molecule, for example, 4,4'-bis[N-(1-naphthyl)-N-phenylamino]biphenyl(NPD), and 4,4',4"-tris[N-(3-methylphenyl)-N-phenylamino]triphenylamine (MTDATA) where, three of the triphenylamine module described in Unexamined Japanese Patent Application Publications No. 4-308688 was connected in shape of a starburst.

Furthermore, a high-polymer material where the above material is introduced into a high-polymer chain or the above material represents a main chain can be used. Also, inorganic compounds such as p type-Si and p type-SiC, can also be used as the hole injection material and hole transporting material.

Moreover, so called a p type hole transporting material that is described in Unexamined Japanese Patent Application Publications No. 11-251067 and a document (Applied Physics Letters 80 (2002), p. 139) authored by J. Huang et. al. can also be used. In the present invention, it is preferable to use the above materials since a higher efficient light emitting device is obtained.

While there is no restriction in particular about the coating thickness of a hole transfer layer, it is usually about 5 nm-5 µm and preferably 5 nm-200 nm. This hole transfer layer may be a single layer structure configured with one or a plurality of the above materials. Moreover, the high hole transfer layer having p nature where impurity is doped can also be used. Unexamined Japanese Patent Application Publications Nos. 4-297076, 2000-196140, 2001-102175, and J. Appl. Phys., 95, 5773 (2004), cite examples of the above. It is preferred to use such the high hole transfer layer having high p nature, since the organic EL device of low power consumption can be produced.

In the present invention, the emission layer indicates a blue emission layer, a green emission layer and a red emission layer. No particular limit is imposed on the order of lamination when the emission layer s are laminated, and also non-light emitting interlayers can be inserted between each emission layer. In the present invention, it is preferable that at least one blue emission layer among all the emission layer s is provided at a position closest to the anode. In addition, in the case more than four emission layer are provide, it is preferable that blue emission layer s, green emission layer s and red emission layer s are laminated from the anode side in an order, such as the orders of blue emission layer/green emission layer/red emission layer/blue emission layer; blue emission layer/green emission layer/red emission layer/blue emission layer green emission layer; blue emission layer/green emission layer/red emission layer/blue emission layer/green emission layer/red emission layer in view of improving luminance stability. By having multiple emission layer s, it becomes possible to manufacture white elements.

There is no particular limit imposed on the total film thickness of the light emitting layer, however considering film uniformity and voltage required for light ejection, it is normally selected in a range of 2 nm-5 µm, and more preferably in a range of 2 nm-200 nm. Furthermore, the film thickness in the a 10 nm-20 nm is more preferable. It is preferable that if the film thickness is less than 20 nm, besides from a view point of voltage, there is an effect that the stability of luminescent color in respect to the drive current is improved. The thickness of each emission layer is preferably selected in the range of 2 nm-100 nm and more preferably in the 2 nm-20 nm. No particular limitation is imposed on the relationship between the thicknesses of the blue, green and red emission layer s, but it is preferable that the thickness of the blue emission layer (in case of a plurality of blue emission layer, the thickness is a total thickness of the layers thereof) is preferred to be the greatest among the three luminescent layers.

The emission layer s preferably include at least three or more layers with different light emission spectrums having maximum light-emitting wavelengths in the ranges of 430-480 nm, 510-550 nm, and 600-640 nm respectively. No particular limitations are imposed provided that there are three or more layers. In the case there are more than four layers, there may be a plurality of layers having the same light emission spectrum. The layer having the maximum light-emitting wavelength in the range 430-480 nm is called the blue emission layer; that having the maximum light-emitting wavelength in the range 510-550 nm is called the green emission layer; and that having the maximum light-emitting wavelength in the range 600-640 nm is called the red emission layer. In addition, a plurality of light-emitting compounds may be mixed into each of the emission layer s as far as the ranges of the foregoing maximum wavelengths are maintained. For example, in the blue emission layer, a blue light-emitting compound having a maximum light-emitting wavelength in the range of 430 nm-480 nm may be mixed with a green light-emitting compound having a maximum light-emitting wavelength in the range of 510 nm-550 nm.

No particular limitation is imposed on the material used in the emission layer, and for example, there are cited on Pages 228-332 of "Recent Trends in Flat Panel Displays, Current and Recent Technology Trends in EL displays" published by Toray Research Center Co., Ltd.

Giving consideration to maintaining the performance of the positive hole transfer layers and the emission layer s and to preventing defects due to attachment of foreign particles, the step for forming the positive hole transfer layers and the emission layer s representing a configuring layer of the organic EL element is preferably to be carried out below a dew point temperature of −20° C., and a purity level of class 5 which is measured conforming to JIS B 9920, under atmospheric pressure conditions of 10° C.-45° C. with the exception of dry portions. In the present invention, a purity level of Class 5 or less indicates Class 3 to Class 5.

The electron injection layer is formed from a material having an electron transfer function, and included in an electron transfer layer in a broad definition of the term. The electron injection layer refers to a layer that is provide between the electrode and the organic layer in order to reduce drive voltage and improve light emission luminance, and is described in detail in Pages 123-166 of the second edition of Chapter 2 of "Electrode Materials" of "Organic EL elements and their Industrialization Frontier" (published by NTS Corporation, Nov. 30, 1998) in detail. The electron injection layer (anode buffer layer) is described in Unexamined Japanese Patent Application Publication Nos. 6-325871, 9-17574 and 10-74586, and specific examples include a metal buffer layer represented by a strontium or aluminum layer, an alkali metal compound buffer layer represented by a lithium fluoride layer, an alkali earth metal compound buffer layer represented by a magnesium fluoride layer, and an oxide buffer layer represented by an aluminum oxide. The above buffer layer (injecting layer) is preferably very thin and to have a thickness of 0.1 nm to 5 μm depending on kinds of the materials used.

Other than the above, the hole transporting material (a positive hole blocking material) used in the hole transporting layer adjacent to the light ejection layer has only to have the function of transferring electrons introduced by the cathode to the emission layer and the material thereof can be suitably selected from known compounds. Examples include a nitro-substituted fluorene derivative, a diphenylquinone derivative, a thiopyran dioxide derivative, a heterocyclic a carbodiimide, a fluolenylidenemethane derivative, an anthraquinodimethane, an enthrone derivative, and an oxadiazole derivative. Furthermore, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group may be used as the electron transporting material. Also, polymer in which the foregoing material is introduced in the polymer chain or a polymer having the material as the polymer main chain can also be used.

Also a metal complex of an 8-quinolynol derivative such as aluminum tris (8-quinolynol) (Alq.), aluminum tris(5,7-dichloro-8-quinolynol), aluminum tris (5,7-dibromo-8-quinolynol), aluminum tris (2-methyl-8-quinolynol), aluminum tris (5-methyl-8-quinolynol), zinc bis(8-quinolynol) (Znq), and a metal complex formed by replacing the central metal of the foregoing complexes with In, Mg, Cu, Ca, Sn, Ga or Pb, can be used as the electron transporting material. Furthermore, a metal free or metal-containing phthalocyanine, and a derivative thereof, in which the terminal is replaced by an alkyl group or a sulfonic acid group, are also preferably used as the electron transporting material. A distyrylpyrazine derivative is also preferably used as the electron transporting material and an inorganic semiconductor such as n-Si and n-SiC may also be used as the electron transporting material in the same manner as in the positive hole injecting layer or hole transfer layer. No particular limited is imposed on the thickness of the electron transfer layer, but it is usually from 5 nm-5 μm, and preferably from 5 nm to 200 nm. The electron transfer layer can be a single layer structure configured with one or two or more of the materials mentioned above.

In addition, an electron transfer layer with high n nature in which impurities are doped may also be used as the electron transfer layer. Examples include those described in Unexamined Japanese Patent Application Publication No. 4-297076, Unexamined Japanese Patent Application Publication No. 10-270172; Japanese Patent Application Publication No. 2000-196140; Japanese Patent Application Publication No. 2001-102175; and J. Appl. Phys., 95,5773 (2004). Using these types of electron transport layers with high n properties is preferable since elements with lower power consumption can be produced. The electron transport layer may be formed by making the foregoing electron transport material a thin film through a known method such as wet coating or vacuum vapor deposition.

A metal (called electron injecting metal), an alloy, or an electroconductive compound each having a small working function (not more than 4 eV), and mixtures thereof are preferably used as the electrode material for the second pixel electrode. Specific examples of this electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Of these, a mixture of an electron injecting metal and a second metal which is a stable metal having a larger working function than that of the electron injecting metal, such as the magnesium/silver mixture, magnesium/aluminum mixture, magnesium/indium mixture, aluminum/aluminum oxide ($Al_2O_3$) mixture, lithium/aluminum mixture, or aluminum is suitable in view of the electron injecting properties and resistance to oxidation. The cathode can be prepared by forming a thin film with these electrode materials through a method such as the vapor deposition or spattering. The sheet resistance as the cathode is preferably not more than several hundred Ω/□, and the thickness of the layer is usually from 10 nm to 5 μm and preferably from 50 nm to 200 nm. It is to be noted that, it is preferable to improve the luminance of the emitted light that either the first pixel electrode (anode) or the second pixel electrode (cathode) of the organic EL element is transparent or semi-transparent so as to transmit the emitted light.

After forming a film of the foregoing metal having a thickness of 1 nm-20 nm on the second pixel electrode, conductive transparent materials cited in the description of the first pixel electrode is formed thereon, thereby the transparent or semi-transparent second electrode pixel (cathode) is formed. By using the above, an element where both the first pixel electrode (anode) and the second pixel electrode (cathode) have transparency is formed.

The light ejection layers configuring the organic EL element of the present invention preferably include a known host compound and a known phosphorescent compound (also called phosphorescent light generating compound) in order to improve emission efficiency of the luminescent layer.

The host compound is defined as a compound whose weight ratio is 20% or more in the layer with respect to the compound included in the emission layer and whose phosphorescence absorbance amount of phosphorescent emission at room temperature (25°) is less than 0.1.

It is preferable that the phosphorescence absorbance amount is less than 0.01. A plurality of kinds of the host compounds may be used together. By using the plurality of kinds of the host compounds together, it becomes possible to adjust transfer of charge and the efficiency of the organic EL element is improved. In addition, different luminescent lights can be mixed by using the plurality of kinds of the phosphorescent compounds together, and as a result, desirable luminescent color can be obtained. By adjusting the kind of phosphorescent compound and doping amount, white luminescent color becomes possible and this may be applied to illuminations and back lights.

The above host compounds are preferably compounds having a hole and electron transporting capabilities and a high Tg (glass transition temperature), to prevent the emission wavelength from elongation. Examples of known host compound include those described in Unexamined Japanese Patent Application Publication Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837.

In the case a plurality of luminescent layers are used, it is preferred that 50 weight % or more of the host compound in each layer is the same compound since this facilitates obtaining an uniform film state across the entire organic layer. Also, the phosphorescent light energy of the host compound is preferably 2.9 eV or more since this suppresses an energy movement from the dopant effectively and high luminance is obtained. Phosphorescent energy is a peak energy of the phosphorescent 0 to 0 band when the photoluminescence of vapor deposited film having a thickness of 100 nm on a host compound substrate is measured.

Considering deterioration of the organic EL element with the passage of time (luminance reduction and deterioration of the film-like state) as well as market needs as a light source, the post compound is preferred to have the phosphorescent energy of preferably 2.9 eV or more and the Tg of 90° C. or more. Namely, in order to satisfy the requirements of both luminance and durability, it is preferable that phosphorescent energy is 2.9 eV or more and the Tg is 90° C. or more. Tg is more preferably to be 100° C. or more.

The phosphorescent compound (phosphorescence emitting compound) is a compound in which emission is observed from excited triplet and is a compound capable of emitting phosphorescence at room temperature (25° C.) where phosphorescence absorption at 25° C. is 0.01 or more. An organic EL with a higher emission efficiency can be obtained by using the phosphorescent compound in combination with the host compound described above.

The phosphorescence absorption of phosphorescent compound related to the present invention is preferably 0.1 or more. The above phosphorescence absorption can be measured through a method described on page 398, Spectroscopy II of "Fourth Edition Experimental Chemistry Lecture 7" (1992 edition published by Maruzen). The phosphorescent compound used in the present invention has only to achieve the above phosphorescence absorption in any suitably selected solvent.

There are cited two principles of light emission of the phosphorescent compound. One is an energy transfer type in which recombination of a carrier occurs on the host compound on which the carrier is transported, then excited state of the host compound is created, and the resulting energy is transferred to the phosphorescent compound, thereby light emission is obtained from the phosphorescent compound. The other is a carry trap type that phosphorescent compound works as a carrier trap, and recombination of a carrier occurs on the phosphorescent compound, thereby light is emitted from the phosphorescent compound. However, in each type, it is a condition that energy level of the phosphorescent compound in an excited state is lower than that of the host compound in the excited state.

The phosphorescent compound can be suitably selected from known compounds used in the emission layer of the organic EL element. The phosphorescent compound is preferably to be a complex compound including metals of group eight to group ten of the periodic table, and more preferably indium compound, osmium compounds or platinum compounds (platinum complex compounds) and rare earth metal complex, and most preferably an indium compound.

In the present invention, no particular limitations are imposed on the phosphorescent luminous wavelength for the phosphorescent compound, but in principle, the luminous wavelength obtained can be changed by selecting a central metal, a ligand or a ligand substitution group.

Figure 4:
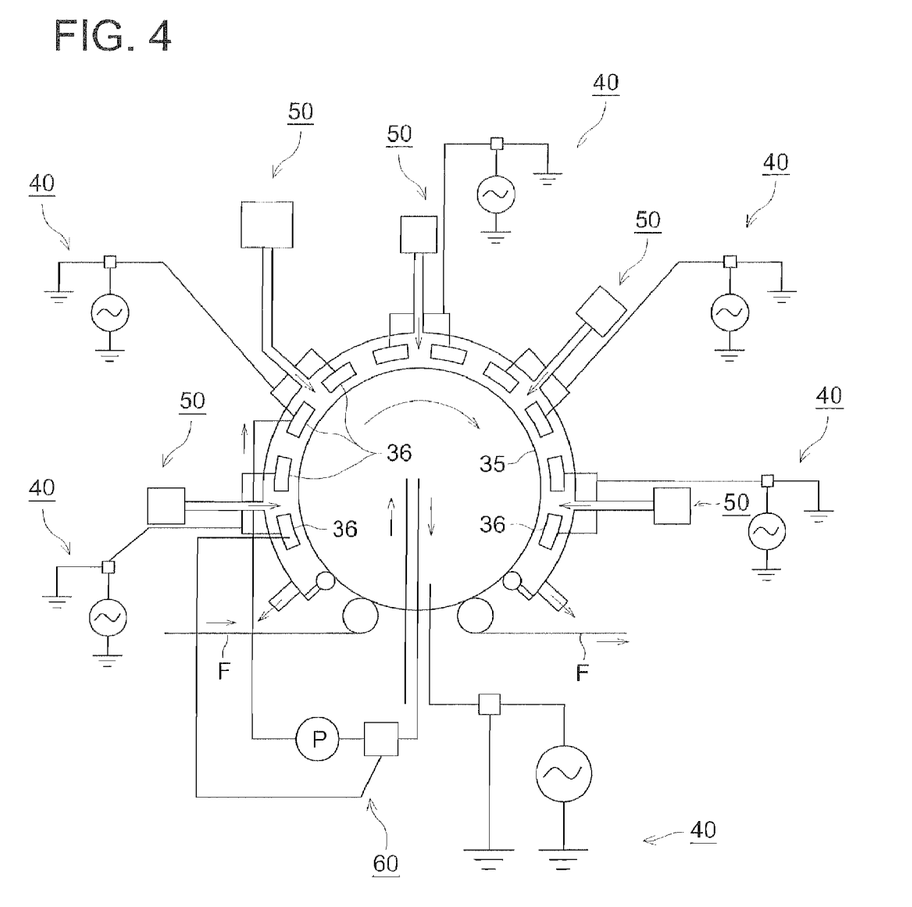
FIG. 4 is a cross-sectioned view of configuration of an atmospheric pressure plasma discharging processing device.

Luminous color of the organic EL element related to the present invention or the compound related to the present invention is determined by that the color is measured by a spectral radiance meter CS-100 (manufactured by Konica Minolta Sensing Inc.) according to a method in figure 4.16 of page 108, of "New edition color science handbook" (the edited by Color Science Association of Japan, University of Tokyo Press, 1985) and the measurement result is adapted to CIE chromaticity coordinates.

The white color element described in the present invention is in an area where chromaticity is $X=0.33\pm0.07$, $Y=0.33\pm0.07$ in calorimetric system CIE1931 at 1000 cd/m$^2$ when luminance of front view angle at two degrees is measured by the above method.

An external extraction efficiency of luminescence (at room temperature) of the organic EL element of the present invention, is preferable to be 1' or more, and more preferably 5 or more.

Here, the external quantum efficiency (%) number of photon emitted to the outside of the organic EL element/number of electron supplied to the organic EL element×100.

Also, there can be used a hue improving filter such as color filter or color conversion filter which changes a luminescent color from an organic EL device into a multiple color using a phosphor can be used together. In case color conversion filter, λ max of luminescence of the organic EL element is preferably 480 nm or less.

In the organic EL element of the present invention, in order to extract the light generated in the emission layer efficiently, it is preferable to use the method shown below together. Generally it is said that organic EL element emitted light inside the layer having a refractive index higher than air (a refractive index is 1.7 to about 2.1), and only about 15 to 20% of the light can be taken out. This is because that the light entering into an interface (interface of a transparent substrate and air) with an angle θ beyond an optimum angle causes total reflection and cannot be extracted outside the element, also the light causes total reflection between the transparent electrode or the emission layer and the transparent substrate then propagates through the transparent electrode or the emission layer by waveguide and as a result the light escapes to a side direction of the element.

As methods to improve the efficiency of light extraction, for example, there are cited a method to prevent total reflection at the interface between the transparent substrate and air by forming convexoconcave on a surface of the transparent substrate (the U.S. Pat. No. 4,774,435 specification), a method to improve the efficiency by giving a condensing nature to a substrate (JP-A No. 63-314795), a method to form a reflection surface on the side surface of the element (JP-A No. 1-220394), a method to form a reflection prevention film by introducing a flat layer having a middle level of refractive index between the substrate and the luminous substance (JP-A No. 62-172691), a method to insert a flat layer having a low refractive index than that of the substrate between the substrate and the luminous substance (JP-A No. 2001-202827) and a method to form a diffraction grating in any one of interlayers of a substrate, a transparent electrode layer, or a light emission layer (including an interlayer between the substrates and external environments) (JP-A No. 11-283751).

In the present invention, while these methods can be used in combination with the organic EL element device, the method to insert a flat layer having a low refractive index than that of the substrate between the substrate and the luminous substance, or the method to form the diffraction grating in any one of interlayers of the substrate, the transparent electrode layer, or the emission layer (including the interlayer between the substrates and external environments) can be preferably used. In the present invention, the element having a high-intensity or a superior durability can be obtained by combining these methods.

If a medium having a low refractive index is formed between a transparent electrode and a transparent substrate with a thickness greater than the wavelength of a light, as the refractive index of the medium decreases, the light from the transparent electrode can be extracted to outside with a high efficiency. As a low-refractive-index layer, for example, aerogel, porous silica, magnesium fluoride, fluorine series polymer, are cited. Since the refractive index of the transparent substrate is generally about 1.5 to 1.7, a low-refractive-index layer having the refractive index of 1.5 or less is preferred and 1.35 or less is further preferred. A thickness of a low-refractive-index medium is preferably to be more than two times of the wavelength in the medium, and if the thickness of the low-refractive-index layer becomes a film thickness substantially equivalent to the wavelength of the light, which allows the electromagnetic waves oozing out by evanescent to enter in the substrate, the effect of the low-refractive-index layer is deteriorated. The method of introducing a diffraction grating into the interface which causes total reflection or into any one of media has a characteristic that the efficiency of extracting the light is enhanced.

In this method, using a nature of the diffraction grating that a direction of light can be changed to a specific direction different from a refraction direction by so called Bragg diffraction such as a primary diffraction or secondary diffraction, the light generated from the emission layer and cannot be extracted due to total reflection is diffracted and extracted outside by introducing the diffraction grating into any one of interlayers or the media (in the transparent substrate or transparent electrode). The diffraction grating to be introduced is preferred to have a two-dimensional periodical refraction index. Since the light generated in the luminescent emission layer goes all directions at random, a general one-dimensional diffraction grating having a periodic diffraction index distribution in a particular direction can only diffracts the light goes in a specific direction, thereby the efficiency of extracting light is not improved as expected. However, by making refractive index distribution to be two-dimensional distribution, the lights going in all the directions are diffracted, and the extraction efficiency of the light increases.

As above-mentioned, a place where the diffraction grating is introduced can be in any one of the interlayers or in the medium (inside of a transparent substrate or a transparent electrode) and a vicinity of the organic emission layer where light is generated is preferable. At this occasion, a period of the diffraction grating is preferred to be about ½ to 3 times the wavelength of light in the medium. The array of the diffraction grating is preferred to be repeated two dimensionally, in shapes of a square lattice, a triangular lattice, or a honeycomb lattice.

Furthermore, in the organic EL element in the present invention, for example, by providing a structure in a shape a micro lens array at an extraction side so as to extract the light generated in the emission layer efficiently or by combining so-called a condensing sheet, light is condensed in a specific direction, for example, to a front direction in respect to a luminescent surface of the element, a luminance in a specific direction can be elevated. As an example a micro lens array, a quadrangular pyramid with an apex angle of 90 degrees and a side length of 30 µm is arranged two-dimensionally on a light extraction side of the substrate. The length of the side is preferred to be 10 µm to 100 µm. If it is smaller than the above, color is created by occurrence of a diffraction effect. If it is lager than the above, it is too thick and not preferable.

As a condensing sheet, for example, one practically used in the LED back light of the liquid crystal display can be used. For example, luminance elevation film (BEF) of the Sumitomo 3M can be used as the sheet. As the shape of the prism sheet, for example, a shape where the stripes having a cross section in a shape of Δ with an apex angle of 90 degrees or the cross section in the shape of Δ with a round apex are formed in a pitch of 50 µm or in the pitch varying at random on the substrate, or other shapes are possible. Also, a light diffusion plate/film can be used in combination with a condensing sheet so as to control the luminous radiation angle of light from a light emitting element. For example, Diffusion film (light up)$^{TN}$ manufactured by Kimoto Co., Ltd. can be used.

EXAMPLE

The present invention will be described by exemplifying embodiments without the present invention being restricted thereto.

Embodiment 1

<<Producing Organic EL Element 1-1>>

As an example of the production method of the organic EL element of the present invention, a production method of the organic element configured with an anode, hole transfer layer, emission layer, electronic transporting layer and cathode will be described. As for the technology in a scope of claims, the techniques applied only for the emission layer is described, however the production method is not limited to application thereof and can be applied for various function layers.

<<Production of a Transparent Gas Barrier Film Substrate>>

On a substrate of Poly Ether Sulphone (a film manufactured by Sumitomo Bakelite Co., Ltd. Hereinafter described as PES) having a thickness of 200 µm, a transparent gas barrier film where three units having a lower density layer, the semi-gross density layer, the high density layer, and the semi-gross density layer are stacked was produced by the following atmospheric pressure plasma discharge processing apparatus under electric discharge conditions below.

(Atmospheric Pressure Plasma Discharge Processing Apparatus)

FIG. 4 is a cross-sectional view of a configuration of Atmospheric pressure plasma discharge processing apparatus. It has the roll rotating electrode 35 as a counter electrode, a plurality of prismatic type electrodes 36, an electric field applying device 40, a gas supply device 50, and an electrode temperature adjusting device 60. A set of the roll rotating electrode 35 covered with a dielectric material and the plurality of the prismatic type electrodes 36 were produced as follows.

The roll rotating electrode 35 to be the first electrode was formed by coating a jacket roll base metal, made of titanium alloy T64 having a cooling device by coolant, with an alumina sprayed film having a high density and high adhesion through the atmospheric pressure plasma method so as to have a roll diameter of 1000 mm ϕ. On the other hand, the prismatic type electrode 36 of the second electrode was formed to be a group of prismatic cylinder type fixed electrodes opposing by coating a hollow prismatic type titanium alloy T64 with the same dielectric material in a thickness of 1 mm at a corner under the same conditions as above.

24 prismatic type electrode 36 are arranged around the roll rotation electrode 35 with a counter electrode gap of 1 mm. A total discharging area of the group of the prismatic type fixed electrodes was, 150 cm (a length of a width direction)×4 cm (a length of a conveyance direction)×24 pieces (number of the electrode)=14400 cm$^2$.

During plasma discharge, the first electrode (roll rotation electrode 35) and the second electrode (group of prismatic type fixed electrodes 36) are adjusted and maintained to be at 80° C. so as to form the film by rotating the roll rotation electrode 35 through a drive. Among the above 24 pieces of prismatic type fixed electrodes 36, from upper stream side, using four pieces for forming a film of a first layer (low density layer 1), subsequent six pieces for a second layer (middle density layer 1), further subsequent eight pieces for a third layer (high density layer 1) and the rest of six pieces for forming a film of a fourth layer (middle density layer 2), four layers are stacked at one time by setting each condition. Further by repeating the above conditions two times the transparent gas barrier film was produced.

(First Layer: Low Density Layer 1)

The low density layer 1 having a thickness of 90 nm was formed by plasma discharging under the following conditions.

<Gas Conditions>

| | |
|---|---|
| Discharge gas: Nitrogen gas | 94.8 volume % |
| Thin film forming gas: Hexamethyldisiloxane (hereinafter abbreviated as HMDSO) (mixed with a nitrogen gas and evaporated through a vaporizer manufactured by LINTEC Corp.) | 0.2 volume % |
| Addition gas: Oxygen gas | 5.0 volume % |

<Power Condition: a Power Source of Only the First Electrode Side was Used>

The first electrode side power supply type; a high-frequency power source manufactured by OYO ELECTRIC CO., LTD.

| | |
|---|---|
| Frequency: | 80 kHz |
| Power density: | 10 W/cm$^2$ |

The density of the first layer (low density layer) formed in the above was 1.90 as a result of measuring by the X-ray refractivity method using MXP21 manufactured by Macscience Co., Ltd.

(Second Layer: Medium Density Layer 1)

The medium density layer 1 having a thickness of 90 nm was formed by plasma discharging under the following conditions.

<Gas Conditions>

| | |
|---|---|
| Discharge gas: nitrogen gas: | 94.9 volume % |
| Thin film forming gas: Hexamethyldisiloxane (hereinafter abbreviated as HMDSO) (mixed with a nitrogen gas and evaporated through a vaporizer manufactured by LINTEC Corp.): | 0.1 volume % |
| Addition gas: Oxygen gas: | 5.0 volume % |

<Power Condition: a Power Source of Only the First Electrode Side was Used>

The 1st electrode side power supply type: a high-frequency power source manufactured by OYO ELECTRIC CO., LTD.

| | |
|---|---|
| Frequency: | 80 kHz |
| Power density: | 10 W/cm$^2$ |

The density of the second layer (medium density layer) formed in the above was 2.05 as a result of measuring by the X-ray refractivity method using MXP21 manufactured by Macscience Co., Ltd.

(Third Layer: Medium Density Layer 1)

The medium density layer 1 having a thickness of 90 nm was formed by plasma discharging under the following conditions.

<Gas Conditions>

| | |
|---|---|
| Discharge gas: Nitrogen gas: | 94.9 volume % |
| Thin film forming gas: Hexamethyldisiloxane (hereinafter abbreviated as HMDSO) (mixed with a nitrogen gas and evaporated through a vaporizer manufactured by LINTEC Corp.): | 0.1 volume % |
| Addition gas: Oxygen gas: | 5.0 volume % |

<Power Condition>

The first electrode side power supply type: a high-frequency power source manufactured by OYO ELECTRIC CO., LTD.

| | |
|---|---|
| Frequency: | 80 kHz |
| Power density: | 10 W/cm$^2$ |

The second electrode side power supply type: a high-frequency power source manufactured by PEARL KOCYO CO., LTD.

| | |
|---|---|
| Frequency: | 13.56 kHz |
| Power density: | 10 W/cm² |

The density of the second layer (medium density layer) formed in the above was 2.20 as a result of measuring by the X-ray refractivity method using MXP21 manufactured by Macscience Co., Ltd.
(Fourth Layer: Medium Density Layer 2)

The medium density layer 2 was formed under the same conditions as that of the aforesaid second layer (medium density layer 2)
(Fifth Layer to 12th Layer)

A transparent gas barrier film is produced by repeating the above process two times under the same condition as that of forming the aforesaid first layer to fourth layer (one unit).

A result of measuring water vapor transmittance by a method based on JIS K 7129-1992, was not more than $10^{-3}$ g/(m²·24 h).

A result of measuring oxygen permeability by the method based on JIS K 7126-1987, was not more than $10^{-3}$ ml/(m²·24 hr·MPa).

Next, patterning is carried out on a substrate on which a film of ITO (indium tin oxide) is formed with a thickness of 120 nm through a film forming method such as a sputtering method, a vapor deposition method or an ion plating method, and alignment marks are formed with the same material on the first pixel electrode and an end or both ends. The first pixel electrode can be an aggregate of fine lines such as a passive matrix.

<<Formation of a Hole Transfer Layer>>

Figure 5A:
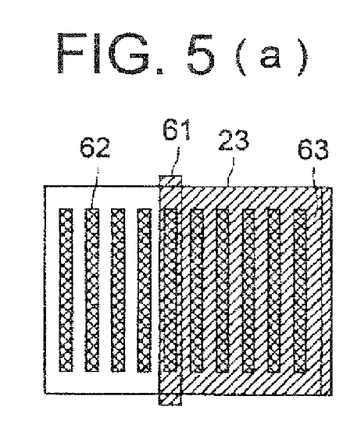
FIGS. 5a, 5b, 5c, 5d, 5e, and 5f illustrate examples of formation of a hole transfer layer, a red light luminescent layer, a green light emission layer, a blue light emission layer, an electronic transporting layer and a cathode.
Figure 5B:
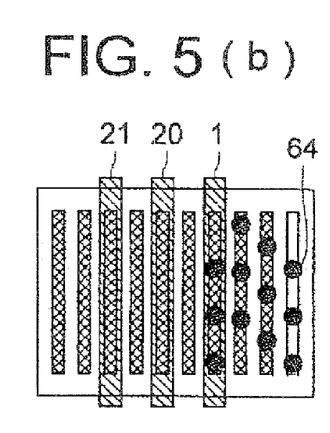
Figure 5C:
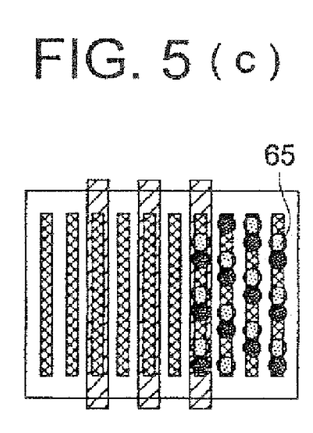
Figure 5D:
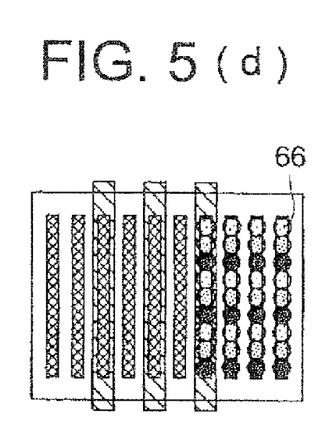

The hole transfer layer of the organic EL element 1-1 of the present invention is formed by a dye coater 61 on the substrate 6 on which the first pixel element electrode 23 shown in FIG. 3 (c) has been formed (it is also called film forming). As shown in FIG. 5 (a), on the first picture element electrode 23, ITO (indium tin oxide) electrode 62 are provided in parallel and the hole transfer layer 63 is formed on the first picture element electrode 23 through the dye coater 61. Meanwhile, the arrow shows a conveyance direction of the first pixel electrode 23 on the substrate 6, and the direction of conveyance (also simply called conveyance direction) is the same direction as the conveyance direction of the substrate 6 in FIG. 3 (c).

A rolled flexible belt sheet where the first pixel electrode is formed is unrolled, then cleaning surface modification processing discharging processing, application liquid film formation processing, solvent removing processing and heat treatment processing were performed consecutively and the sheet is rolled up in shape of a roll. Thereby the hole transfer layer is formed.

For the cleaning surface modification processing, a low pressure mercury lamp, an excimer lamp, and a plasma cleaning apparatus can be used.

In this embodiment, as a dry cleaning surface modification processing apparatus, a low pressure mercury lamp having a wavelength of 184.9 nm, and an irradiation intensity of 15 mW/cm², was used with an exposure distance of 10 mm. With this processing, surface modification i.e. organic contamination object elimination and improvement of wettability is performed.

Discharging process can be roughly divided into a light radiation method and a corona discharging method. The light radiation method and the corona discharge method create an atmospheric ion by an imperceptive X-ray and by corona discharge respectively. This atmospheric ion is drawn by a charged substance, and sets off charged of an opposite polarity to neutralizes static electricity. A discharging device with corona discharging and a discharging device with the imperceptive X-ray can be used.

In this embodiment, the discharging device with the imperceptive X-ray was used. With this processing, discharging of the substrate is carried out to prevent adhesion of foreign matter and a dielectric breakdown, thereby improvement in the yield of the element is achieved.

As an coating film formation process, a continuation wet forming-film method such as a die coat method, a screen printing method, a flexography method, an ink jet method, a mayer bar method, a cap coat method, a spray coating method, a cast method, a roll coat method, the burr coat method and the gravure coat method, can be used. These film forming methods can be suitably chosen according to the material of the organic compound layer. The flexible substrate to be conveyed is adhered and conveyed onto a back up roll, and a dye coater to form the coating film is arranged above the back up roll with a certain distance from the substrate. Meanwhile, the back up roll may be suitably equipped with the cleaning device unit. A solvent prepared in a tank is supplied to the dye coater through a precision pump such as a gear pump so that the amount of the liquid fed is controlled. The liquid fed fills inside of a manifold through a filter to keep a pressure of a chamber at a certain level and spreads from an application liquid head on the substrate evenly through a slit to form a film. A thickness of coating liquid film is suitably adjusted by the transportation speed of the substrate, the feeding amount of liquid, and a density of the liquid. A fluctuation of conveyance speed at forming the application liquid film is preferred to be 0.2% to 10% in respect to an average liquid application speed and further preferred to be 0.2% to 3%. Thereby an accuracy of thickness in a longitudinal direction is maintained and uniformity of light emitting property is realized.

In the present embodiment, the hole transfer layer is formed so that the thickness after desiccation becomes 50 nm with a solvent where polyethylene diauxie thiophene polystyrene sulfonate (PEDOT/PSS product made by Bayer Bytron P AI. 4083) is diluted with methanol by 5% and with pure water by 65%.

In the present invention, as a solvent removing processing, the solvent is removed by heated air flow in desiccation treatment after application. The desiccation treatment was carried out from an exhaust nozzle of a slit nozzle type towards the surface of the film at a height of 100 mm, with a blowing speed of 1 m/s, a distribution in the width direction 5% and a drying temperature of 100° C. A dry kiln is capable of appropriately changing temperature and blowing speed in several zones in accordance with the material of the organic compound layer.

As the heat treatment processing in the present invention, after removing the solvent, the substrate is adhered by suctioning through a gap between the rollers which are densely-arranged heat rolls at 150° C. and conveyed then heat treatment was carried out by heating through reverse surface heat transfer. The present example is an example and the present invention is not limited to this example as far as methods utilize the reverse surface heat transfer. The heat treatment is preferable to be carried out at a glass transition temperature ±50° C. without exceeding a decomposition temperature through reverse surface heat transfer. By carrying out the heat treatment, uniformity of the film, removing of remaining solvent and hardening of the film were realized, thereby element characteristic at stacking is improved.

The rewound roll is kept in a storing box, and stored under a reduced pressure ($10^{-6}$ to $10^{-2}$ Pa). The temperature can be increased appropriately. A storage time is preferably one hour to 200 hours, and the longer the better. Thereby the trace of water and oxygen causing deterioration of the element is removed.

<<Formation of Luminescent Emission Layer>>

In emission layer formation (it is also called film forming) of the organic EL element 1-1 of the present invention, as shown in FIG. 5 (b) to FIG. 5 (d), a red emission layer, green emission layer, and blue luminescent are formed respectively.

FIG. 5 (b) is a schematic diagram showing an example by which the red luminescent is patterned on an ITO electrode 61 by the droplet ejection head 1 of the patterning apparatus which has a speed detection device 21 and a picture image detection device 20. Similarly, FIG. 5 (c) is a schematic diagram showing an example by which the green emission layer is patterned on the ITO electrode 61, and FIG. 5 (d) is a schematic diagram showing an example by which the blue emission layer is patterned on the ITO electrode 61.

[Coating Apparatus]

As the above patterning apparatus, the emission layer s (red, green and blue) were formed using a patterning apparatus as shown in FIG. 1.

A film was formed for the whole coating width of W=450 mm so that a emission layer pattern film is formed on one side of a polyether sulphone (hereinafter abbreviated as PES) film having a substrate width of 500 mm and a thickness of 200 micrometers. In addition, film forming was carried out continuously for one hour with the substrate transportation speed of 1 m/min.

Meanwhile, the transportation speed of the substrate related to the present invention is preferable to be 5 nm/min or less and more preferably in a range of 1 m/min-5 m/min. The clearance distance between the ink ejection surface of the nozzle 3 of the droplet ejection head 1 and the substrate 6 was 1 mm. Adjustment of wet-film thickness required for film formation was carried out by changing ejection frequency. The droplet ejection head 1 used for evaluation is a piezoelectric type having a nozzle diameter of 30 μm, an amount of coating liquid per droplet of 40 pl, a nozzle density of 360 dpi (dpi represents the dot number per 25.4 mm), a nozzle pitch of p=70.5 μm, and number of nozzles of n=512 (nozzle pitch N−1=511).

In this embodiment, coating width w=p×(n−1) per one droplet ejection head 1 is 63.5 μm×511=32.4 mm. Sets of the liquid ejection heads 1 in quantity of N were arranged in the coating width direction of the substrate 6. When the total coating width W of the substrate 6 is of W=450 mm, the quantity N of a plurality of sets of the droplet ejection heads 1 is W(=450 mm)/w(=32.4 mm)=13.9, namely N=14.

Next, after performing a discharging process suitably, the emission layer was formed on the hole transfer layer.

In this occasion, droplet ejection was controlled by combining the detection data of the image detection device for alignment mark detection and the speed detection device to detect the conveyance speed. The above process was carried out in a film forming chamber which is capable of adjusting temperature and humidity as an ejection atmosphere.

5 wt % of green dopant material Ir(ppy)$_3$ was mixed with polyvinyl carbazole (PVK) of the host material, and dissolved into 1,2-dichloroethane, so as to obtain a solution having solid contents of 1 wt %. On a hole transfer layer, a film was formed with the solution through a solution ejection method in a way that the thickness after desiccation becomes 100 nm to provide a emission layer.

Next using the same drying kiln used in forming the hole transfer layer, desiccation is carried out at 100 degrees C. and subsequently heat-treatment was carried out at 100 degrees C.

After heat-treatment, the substrate is cooled down to the same temperature as room temperature, in a same manner as above, a red dopant material btp$_2$Ir (acac) was mixed with PVK to be 10 wt % and the mixture is dissolved into 1,2-dichloroethane so as to obtain a solution having the solid contents of 1 wt %, and a blue dopant material FIr(pic) was mixed with PVK to be 3 wt % and the mixture is dissolved into 1,2-dichloroethane, so as to obtain a solution having the solid contents of 1 wt %, then films were formed respectively through droplet ejection method and desiccation heating treatment was carried out.

The structural formula of the dopant material used is shown below.

[Formula 1]

Ir(ppy)$_3$

FIr(pic)

btp$_2$Ir(acac)

<<An Electronic Transporting Layer, Cathode>>

Figure 5E:
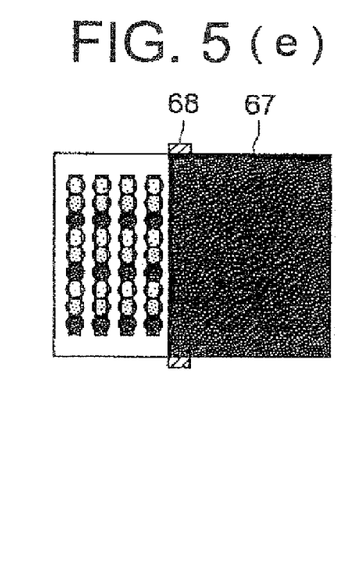
Figure 5F:
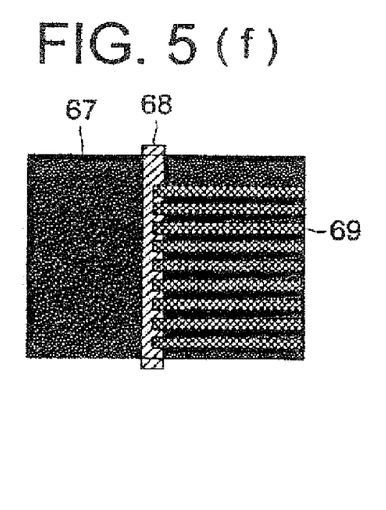

As an example of post process after the above mentioned emission layer forming process, an electronic transporting layer 67 having a film thickness of 30 nm was formed by vapor deposition of a compound (2) representing an electron transport material on the whole area of the first pixel electrode 23 using a vacuum evaporation head 68 on the emission layer under the vacuum of 5×10$^{-4}$ Pa. Subsequently, a LiF layer having a thickness of 0.5 nm was formed by vapor deposition on the electronic transporting layer 67.

Subsequently, an organic EL layer region (here, an organic EL layer region means a region configured with the hole transfer layer 63 which is formed on the ITO electrode 62 of the first pixel electrode 23, the red emission layer, the green emission layer 65, the blue emission layer 66, and the electronic transporting layer 67) and a region including an electrode exposing region are deposited by aluminum layer having a thickness of 100 nm in the same manner. After forming in this sequence, an inorganic film such as SiOx, SiNx and composite membrane as a sealing membrane having a thickness of 300 nm is formed through the sputtering method, plasma CVD method, or the ion plating method in an area except for the area where the electrode is formed and wound, thereby an organic EL element 1-1 (present invention) was obtained. Meanwhile before forming the inorganic film, a polymer layer of a stress relief layer can be formed through vapor deposition or evaporation polymerization, or a low stress inorganic film can be formed by plasma CVD.

[Formula 2]

Compound (2)

After sealing the film, a method where the film is wound continuously and cut in the next process to be a panel or a method where the film is cut subsequently without being wound and stored in a stocker can be appropriately selected. In the present invention, the method where the film is subsequently cut is used.

<<Production of the Organic EL Element 1-2>>: Present Invention

The organic EL element 1-2 was produced in the same manner as the organic EL element 1-1 except for changing forming of the electronic transporting layer, the cathode, and the sealing film (it is also called sealing membrane) as follows and changing the conveyance starting speed and completion speed as described in Tables 1 and 2.

<<An Electronic Transporting Layer, Cathode>>

As a post process after forming the luminescent layer, under vacuum of $5 \times 10^{-4}$ Pa, the Lif layer having a thickness of 0.5 nm is deposited on the above film obtained and the aluminum layer having a thickness of 100 nm is also deposited in the same manner, then it is wound after forming in this order. It is the same as forming of the electronic transporting layer and cathode forming except forming of sealing film.

In addition, forming the sealing film (it is also called sealing membrane) for the organic EL elements 1-1 and 1-2 of the present invention was performed as follows.

<Formation of a Sealing Film (it is also called Sealing Membrane)>>

After above rolling up, it is kept under a reduction pressure or in an inert gas in the same manner as the after the emission layer forming process.

Subsequently, the above mentioned rolling-up roll under the inert gas is unrolled, and a UV hardenable epoxy resin (UV resin XNR5570-B1 manufactured by Nagase Chemtex corp.) is applied by the dye coater except for the electrode terminal portions, then a resin film having a gas barrier property is laminated, thereafter the resin film is adhered by radiation of a UV lamp from a cathode side.

The epoxy resin of adhesive agent can be a thermal hardening type. In this case, heat pressure bonding is carried out by going through between heat rollers. Also a sealing adhesive agent can be formed only at a periphery of the light emitting area through a dispenser or screen printing. The gas barrier film used in the present example is the same as the substrate when the organic EL layer is formed except that the transparent electrode is not equipped.

After adhesion sealing, a method where the film is wound continuously and cut in the next process to be a panel or a method where the film is cut subsequently without being wound and stored in a stocker can be appropriately selected. In the present invention, the method where the film is subsequently cut and send to the next process is used.

<<Production of the Organic EL Element 1-3>>: Comparative Example

The organic EL element 1-3 was produced in the same manner as the organic EL element 1-1 except that the speed detection device and the image detection device at conveying the substrate and ejection control device to combine the feedback data of the image detection device and the speed detection device are not provided.

<<Evaluation of an Organic EL Element>>

To obtained organic El elements 1-1, and 1-2 (present invention) and the organic EL device 1-3 (comparative example) a voltage of 10 V were applied and visual observation of the lighting characteristics were carried out to evaluate the lighting characteristics and to rank based on the criteria described as follow.

<<The Criteria of Ranking Evaluation>>

A: Whole surface of all the light emitting section showed preferable light emission.

B: Whole surface of the light emitting section showed preferable light emission.

C: Non emission of light was locally observed

D: Relatively large non light emitting areas were observed.

TABLE 1

| Organic EL element No. | Whether or not the alignment mark is provided | Whether or not the conveyance speed detecting device is provided or not | Conveyance speed at start m/min. | Conveyance speed at completion m/min. |
| --- | --- | --- | --- | --- |
| 1-1 | provide at one side | Provided | 1.0 | 1.0 |
| 1-2 | provide at one side | Provided | 5.0 | 5.0 |
| 1-3 | provide at one side | Not provided | 1.0 | 1.0 |

TABLE 2

| Organic EL element No. | light emission | Reason | Remark |
| --- | --- | --- | --- |
| 1-1 | B | Capable of coping with fluctuation of conveyance speed | The present invention |
| 1-2 | B | Capable of coping with fluctuation of conveyance speed | The present invention |
| 1-3 | D | Not capable of coping with fluctuation of conveyance speed | Comparative example |

By performing speed detection, patterning can be performed without the substrate being wasted even in a status before the transportation speed of a substrate becomes stable.

Moreover, in the production method of the organic EL element of the present invention, there are three luminescent colors of blue, green, and red respectively, and a white organic EL element can be produced by mixing dopant materials Ir(ppy)$_3$, FIr(pic), and btp$_2$Ir(acac) appropriately. This can be used as lighting device and the present invention can offer the manufacturing facilities for illumination with a high productivity and low cost.

Embodiment 2

<<Production of the Organic EL Element 2-1>>: Present Invention

The organic EL element 2-1 was produced in the same manner as producing the organic EL element 1-1 in the exemplary embodiment 1 except that the speed detection device to detect the transportation speed of the substrate, the image detection device and the ejection control device to combine the feedback data of the speed detection device and the image detection device are not provided, instead the nozzle device can be trimmed and conveyance starting speed and conveyance completion speed are changed as shown in Table 3.

<<Production of the Organic EL Elements 2-2 to 2-6>>

The organic EL elements 2-2 to 2-6 were produced in the same manner as the organic EL elements 2-1 except that the conditions of production were changed as the Tables 3 and 4 describe.

The obtained organic EL elements 2-2 to 2-6 were evaluated in the same manner as the exemplary embodiment 1.

TABLE 3

| Organic EL element No. | Alignment mark One side | Alignment mark Both side | Whether or not the speed detection | Whether or not nozzle device trimming is provided | Conveyance speed at start m/min. |
|---|---|---|---|---|---|
| 2-1 | B | | Provided | Provided | 1.0 |
| 2-2 | B | | Provided | Not provided | 5.0 |
| 2-3 | | B | Provided | Provided | 1.0 |
| 2-4 | | B | Provided | Not provided | 5.0 |
| 2-5 | | B | Not provided | Not provided | 5.0 |
| 2-6 | | B | Not provided | Not provided | 5.5 |

TABLE 4

| Organic EL element No. | first color emission | Second color emission | Third color emission | Reason | Remark |
|---|---|---|---|---|---|
| 2-1 | B | B | B | Capable of coping with contraction of the substrate | Inv. |
| 2-2 | B | B | C | Capable of coping with contraction of the substrate | Inv. |
| 2-3 | A | A | A | Fully capable of coping with contraction of the substrate | Inv. |
| 2-4 | A | A | B | Fully capable of coping with contraction of the substrate | Inv. |
| 2-5 | C | C | D | Not sufficient to cope with contraction of the substrate | Comp. |
| 2-6 | D | D | D | Not capable of coping with contraction of the substrate | Comp. |

Inv.: The present invention, Comp.: Comparative example

As for patterning of a first color of the EL layer, patterning can be carried out with a reasonable accuracy with one side alignment on the substrate. However, as for the second layer or later, since the patterning is carried out after the desiccation process of the droplet of the first layer, contraction of the substrate occurs by the desiccation of the first layer, therefore a minute position difference occurs in the width direction of the substrate. In this point of view, by providing the alignment marks at both side in the width direction of the substrate, the contraction of the substrate is detected and patterning in a state where position adjustment is correctly performed became possible.

What is claimed is:

1. A patterning apparatus, comprising:
   a nozzle ejection device to eject a function liquid onto a substrate fed as a continuing flexible sheet in a shape of a belt through the apparatus in a conveying direction;
   an image detection device upstream in the conveyance direction of the nozzle ejection device to detect an alignment mark formed on the substrate in advance of ejecting the function liquid through the nozzle ejection device onto the substrate;
   a speed detection device upstream in the conveyance direction of the nozzle ejection device to detect a conveyance speed of the substrate to be conveyed; and
   an ejection control device to combine feedback data from the image detection device and the speed detection device so as to create an ejection command signal;
   wherein the function liquid is ejected through the nozzle ejection device onto the substrate being conveyed in accordance with the ejection command signal of the ejection control device.

2. The patterning apparatus described in claim 1, wherein the substrate has alignment marks on both sides of the substrate the feedback data of the image detection device detects an amount of elongation and misalignment of the substrate based on the alignment marks formed on both sides of the substrate which are parallel to the conveyance direction of the substrate and ejection is carried out while carrying out fine adjustment of the nozzle ejection device based on a detected result thereof.

3. A manufacturing method of an organic electroluminescence element having at least one function layer between an anode and a cathode on a substrate, wherein the at least one function layer is formed by the patterning apparatus described in claim 1.

4. The manufacturing method of the organic electroluminescence element described in claim 3, wherein the nozzle ejection device is configured by arranging a plurality of nozzle ejection heads in a width direction of the substrate.

5. The manufacturing method of the organic electroluminescence element described in claim 3, wherein the substrate is unwound from a roll, fed as a continuing flexible sheet in a shape of a belt and subsequently rewound onto another roll.

6. The manufacturing method of the organic electroluminescence element described in claim 3, wherein at least three nozzle ejection devices provided in the conveyance direction respectively eject any one of an organic electroluminescence function liquid to form luminescent layers which have luminescent colors selected among blue, green and red.

7. The manufacturing method of the organic electroluminescence element described in claim 3, wherein the conveyance speed of the substrate is 5 m/min, or less.

8. The manufacturing method of the organic electroluminescence element described in claim 3, wherein a fluctuation of the conveyance speed of the substrate is ±10% or less in respect to an average speed of the substrate.

9. An organic electroluminescence element produced by the manufacturing method of the organic electroluminescence element described in claim 3, wherein a light emitting mechanism is based on phosphorescence.

10. An organic electroluminescence display unit, comprising a plurality of the organic electroluminescence elements described in claim 9.

11. A patterning apparatus comprising:
- a conveyor device for conveying a substrate as a continuing flexible sheet in a shape of a belt through the apparatus in a conveyance direction at a conveyance speed;
- a nozzle ejection device to eject a function liquid onto the substrate as the substrate is conveyed through the apparatus;
- an image detection device upstream in the conveyance direction of the nozzle ejection device to detect an alignment mark formed on the substrate in advance of ejecting the function liquid through the nozzle ejection device onto the substrate, as the substrate is conveyed through the apparatus;
- a speed detection device upstream in the conveyance direction of the nozzle ejection device to detect the conveyance speed of the substrate conveyed through the apparatus; and
- an ejection control device to combine feedback data from the image detection device and the speed detection device so as to create an ejection command signal,
- wherein the function liquid is ejected through the nozzle ejection device onto the substrate as the substrate is conveyed through the apparatus in accordance with the ejection command signal of the ejection control device.

* * * * *